United States Patent [19]

Gessaman

[11] Patent Number: 5,559,676
[45] Date of Patent: Sep. 24, 1996

[54] SELF-CONTAINED DROP-IN COMPONENT

[76] Inventor: Martin J. Gessaman, P.O. Box 219, Sebago Lake, Me. 04075

[21] Appl. No.: 475,988

[22] Filed: Jun. 7, 1995

[51] Int. Cl.⁶ ..................................................... H05K 5/00
[52] U.S. Cl. .......................... 361/752; 361/736; 361/748; 361/816; 361/818; 361/784; 361/790; 174/35 R; 174/35 GC; 174/50; 174/52.4; 439/88; 439/608; 379/437; 379/440
[58] Field of Search ...................... 361/728, 736, 361/738, 752, 753, 757, 816, 818, 820, 821, 212, 220, 744, 784, 790, 748; 174/35 R, 35 GC, 50, 52.1, 35 TS, 52.4, 51, 35 MS; 379/437, 440; 439/88, 108, 109, 607–610; 455/90, 89, 300, 301; 257/659, 660, 728

[56] References Cited

U.S. PATENT DOCUMENTS

| 4,452,359 | 6/1984 | Koppensteiner . | |
|---|---|---|---|
| 4,717,990 | 1/1988 | Tugcu et al. . | |
| 4,990,393 | 2/1991 | Shibano et al. . | |
| 5,014,160 | 5/1991 | McCoy, Jr. . | |
| 5,099,396 | 3/1992 | Barz et al. . | |
| 5,311,402 | 5/1994 | Kobayashi et al. . | |
| 5,353,201 | 10/1994 | Maeda et al. ........................... | 361/816 |
| 5,354,951 | 10/1994 | Lange, Sr. et al. ................... | 174/35 R |

OTHER PUBLICATIONS

"Style CBS Circuit Board Component Shielding", no date listed, pp. 1–8, Leader Tech, Tampa, Florida.

Primary Examiner—Leo P. Picard
Assistant Examiner—Anthony Dinkins
Attorney, Agent, or Firm—Young & Thompson

[57] ABSTRACT

A housing for circuitry is provided which includes a base in the form of a printed circuit board having a plurality of apertures therethrough which extend about the periphery thereof. A side rail includes legs each of which extends through a respective base aperture and is bent against an external surface of the base. The side rail also includes clips into which the side of a cover is inserted to enclose the housing.

20 Claims, 4 Drawing Sheets

SELF-CONTAINED DROP-IN COMPONENT

BACKGROUND OF THE INVENTION

1. Field of the Invention

The present invention relates to a self-contained drop-in component for electronic circuitry. The present invention is particularly applicable to such a component for radio frequency and microwave circuitry.

2. Description of Prior Art

Filters and other individual self-contained components such as couplers, amplifiers, and mixers are combined together to perform various signal processing functions in numerous communication and navigation systems. With the advent of commercial wireless systems, these components must show a significant reduction in price and become available in large volume. The present invention addresses both of these issues.

Current packaging technology is an outgrowth of military applications where price and large volume are not critical concerns. As a result, self-contained surface mount components currently available are constructed using exotic ceramic materials with glass to metal seals that are expensive to produce and can not easily make the transition to large volume without large capital expenditures.

Attempts at inexpensive packaging include using dual in-line package construction, popular with computer chips, and injection molded packages incorporating a fingered header. The main problem with these devices is the lead inductance which is incurred as a result of metal leads which extend out of the side of the packages and are bent down to form the connection. This technique becomes more of a problem as the frequency of the circuit increases. The lead inductance adds an element of uncertainty to the final circuit performance when connected to the end user's printed circuit board, and layout becomes critical to avoid cross talk to other circuit components.

It is an object of the present invention to provide an improved self-contained drop-in component for electronic circuitry.

It is another object of the present invention to provide a self-contained drop-in component for packaging radio frequency and microwave circuits in a surface mount configuration.

It is a further object of the present invention to provide a self-contained drop-in component for electronic circuitry which also forms part of the circuitry contained therein.

Yet another object of the present invention is to provide such a self-contained drop-in component which may be fabricated relatively inexpensively using standard metal stamping techniques and standard printed circuit board processing.

A further object of the present invention is to provide a self-contained drop-in component for electronic circuitry which can be mass produced at low cost.

SUMMARY OF THE INVENTION

This invention achieves these and other results discussed herein by providing a self contained drop-in component, comprising a first printed circuit board removably attachable to a second printed circuit board. The first printed circuit board includes a self-contained circuit including an input and an output electrically and mechanically connected to the self-contained circuit and electrically and mechanically connectable to and disconnectable from a circuit of the second printed circuit board. The first printed circuit board includes an edge which forms a periphery of the component and the first printed circuit board has a plurality of apertures extending therethrough adjacent such periphery. A side rail is provided adjacent the periphery and comprises a plurality of legs, respective legs of the plurality of legs extending in a first direction through respective apertures of the plurality of apertures, and a plurality of clips extending in an opposite second direction. One or more of the respective legs comprises a length which is folded against a conductive portion of a surface of the first printed circuit board which is external of the component. The side rail peripherally encloses the self-contained circuit. A cover comprises a side which is attached to the side rail by the plurality of clips, the printed circuit board, side rail and cover comprising a housing having a housing cavity in which the self-contained circuit is positioned. A method of fabricating a self-contained drop-in component is also disclosed.

BRIEF DESCRIPTION OF THE DRAWINGS

This invention may be clearly understood by reference to the attached drawings in which.

DESCRIPTION OF THE PREFERRED EMBODIMENT

Figure 1:
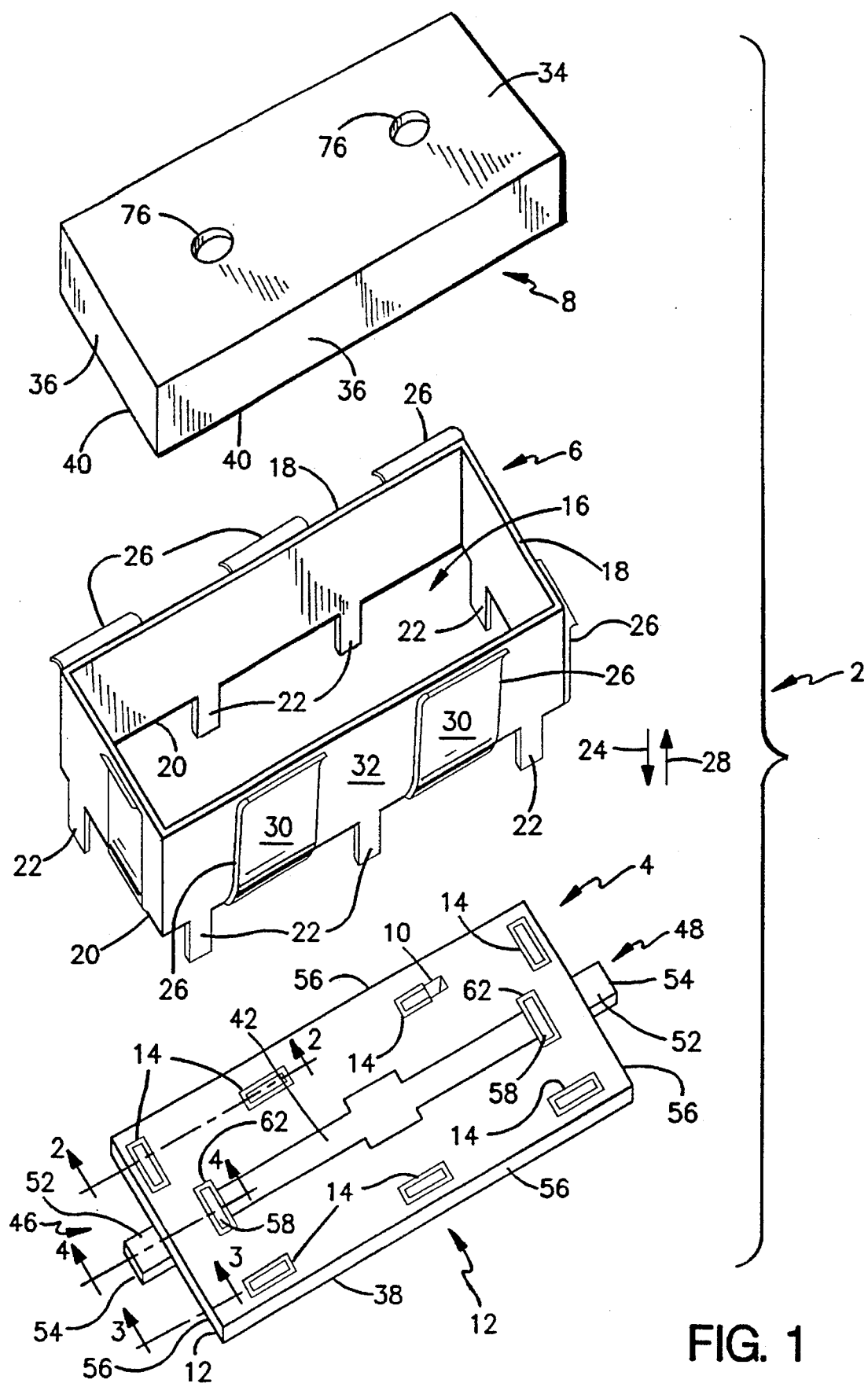
FIG. 1 is an exploded perspective view of the preferred embodiment of a self-contained drop-in component of the present invention.

The embodiment of this invention which is illustrated in the drawings is particularly suited for achieving the objects of this invention. FIG. 1 depicts a self-contained drop-in component 2 which comprises a printed circuit board 4, a side rail 6 and a cover 8.

Printed circuit board 4 comprises a plurality of apertures extending therethrough. In the embodiment of FIG. 1, printed circuit board 4 includes a plurality of apertures 10 which are positioned about an edge 12 which forms a periphery of the component 2. The printed circuit board 4 is in the form of a header by which is meant that the printed circuit board serves as a support for the remaining component parts and as part of a self-contained circuit contained within the component. At least one aperture 10 may be lined with an electrically conductive plating material 14. Due to the presence of plating material 14, only one aperture 10 is visible in FIG. 1, the plating material having been partially removed from the drawing for the purpose of depicting such aperture 10. For example, in the embodiment of FIG. 1, each aperture 10 is lined with a plating material 14. Without limitation, plating material 14 may be copper.

Side rail 6 encloses an opening 16 which extends from an upper edge 18 to an opposite lower edge 20. Side rail 6 comprises a plurality of legs which extend in a first direction through respective apertures of the printed circuit board 4. In the embodiment of FIG. 1, side rail 6 comprises a plurality of sides having a plurality of legs 22 which extend in a direction 24 through respective apertures 10. Side rail 6 also comprises a plurality of clips which extend from the side rail in an opposite second direction. In the embodiment of FIG. 1, side rail 6 comprises a plurality of clips 26 which extend from the side rail in a direction 28 which is opposite to direction 24. In the preferred embodiment each clip 26 is formed by a first portion 30 of the side rail 6 which is folded back towards a second portion 32 of the side rail and extends in direction 28. The side rail 6 of the present invention may be stamped from sheet metal and folded to obtain a peripheral configuration and size which is substantially the same as the peripheral configuration and size of the printed circuit board 4. It will be apparent to those skilled in the art that the peripheral configuration may be rectangular, circular, square or any other desired shape.

Cover 8 comprises a top surface and a side comprising a plurality of side portions extending therefrom which are attached to respective clips 30. In the embodiment of FIG. 1, cover 8 comprises a top surface 34 and a plurality of side portions 36. Each side portion 36 is attached to at least one respective clip 26 as described herein.

Figure 2:
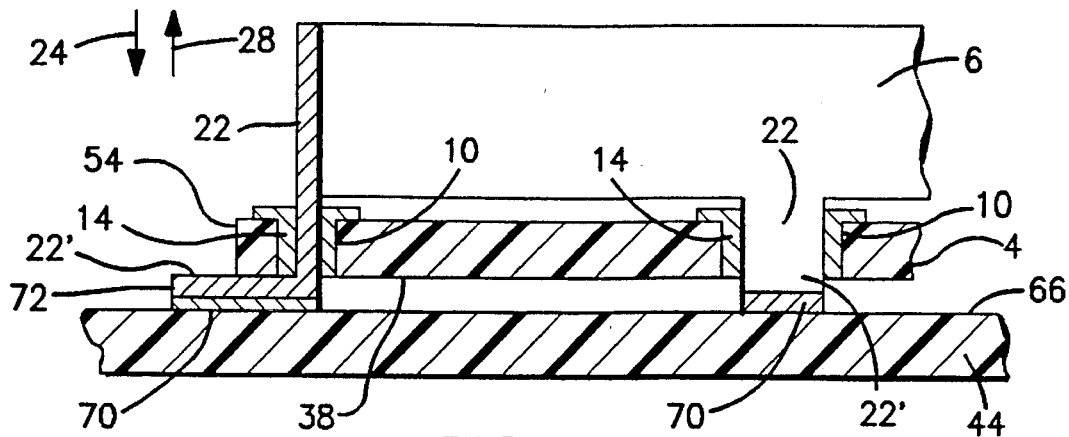
FIG. 2 is a section view of FIG. 1 assembled along line 2—2 in FIG. 1, with the cover 8 removed for clarity.
Figure 3:
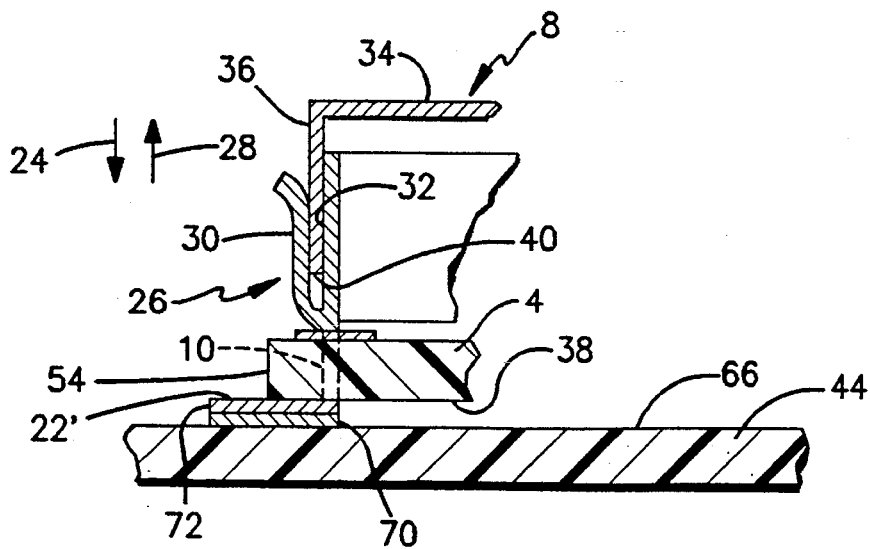
FIG. 3 is a section view of FIG. 1 assembled along line 3—3 in FIG. 1, with the input 46 removed for clarity.

With reference to FIGS. 1 and 2, in assembling the component 2, the side rail 6 is attached to the printed circuit board 4, by inserting legs 22 into apertures 10. Each leg 22 comprises a length 22' which is folded against a conductive portion of a surface 38 of the printed circuit board 4. Surface 38 is an external surface of the component 2. With reference to FIGS. 1 and 3, the cover 8 is then attached to the side rail 6 by inserting an edge 40 of each side portion 36 into a respective clip 26 such that each side portion 36 is sandwiched between portions 30 and 32 of the side rail as depicted in FIG. 3. In the preferred embodiment, the cover 8 is stamped from sheet metal and folded to obtain the configuration of FIG. 1. Side rail 6 and cover 8 may be of the type described in U.S. Pat. No. 5,354,951 naming Lange, Sr. et al. as patentees.

Figure 4:
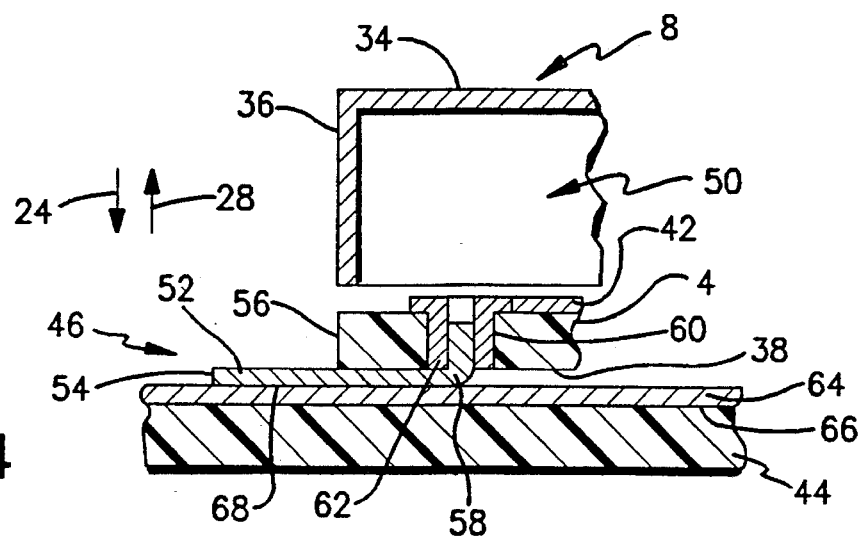
FIG. 4 is a section view along line 4—4 of base 4 in FIG. 1 with the cover 8 superimposed for clarity.

Printed circuit board 4 includes a self-contained circuit thereon which is represented diagrammatically by circuit 42. Circuit 42 may be any desired circuit, the particular circuit not forming a part of the present invention. However, circuit 42 is attached to the printed circuit board 4 by surface mount connection techniques; that is, the circuit 42 is mounted directly to the top surface of printed circuit board 4 rather than as in the more conventional printed circuit boards where various components of the circuit are attached to the circuit board by causing various leads of such components to extend through apertures in the circuit board base. Circuit 42 is removably attachable to another printed circuit board 44 as depicted in FIG. 4. To this end, and with reference to FIG. 1, printed circuit board 4 includes an input 46 and an output 48 which are electrically and mechanically connected to the self-contained circuit 42. In the embodiment of FIG. 1, input 46 and output 48 are identical. When assembled, the printed circuit board 4, side rail 6 and cover 8 form a housing having a housing cavity 50 in which the self-contained circuit 42 is positioned. Input 46 and output 48 are each in the form of a connector which extends out of such housing from housing cavity 50 as depicted in FIG. 4 regarding input 46. Since input 46 and output 48 are identical, only input 46 is described herein. Input 46 comprises a segment 52 which is folded against external surface 38 of the printed circuit board 4. Segment 52 includes a distal end 54 which extends beyond the edge 56 of the printed circuit board 4. The input 46 includes another segment 58 which extends about 90° relative to surface 38. Segment 58 extends into a connect hole 60, which extends through the printed circuit board 4, and is electrically and mechanically connected to the self-contained circuit 42. For example, in the embodiment of FIGS. 1 and 4, an electrically conductive material 62 lines the connector hole 60. The electrically conductive material 62 is electrically and mechanically connected to the self contained circuit 42 and to segment 58 of the input 46. Input 46 is electrically and mechanically connectable to and disconnectable from a circuit 64 of the circuit board 44 at, for example, a solder joint at the interface 68 between segment 52 and circuit 64, and soldering segment 52 to circuit 64. Connection is made between input 46 and circuit 64 by merely dropping the surface 38 upon the circuit 64 at upper surface 66 of circuit board 44 such that segment 52 is adjacent circuit 64. As noted, output 48 is identical to input 46 including comprising a segment 58 which is electrically and mechanically connected to self-contained circuit 42 and a segment 52 which is electrically and mechanically connectable and disconnectable to circuit 64, in the same manner as input 46.

It is desirable to ground the component 2. In the embodiment of FIGS. 1 to 4, this will be effected when a leg length 22' contacts a ground point 70 on the surface 66 of printed circuit board 44, during the dropping step discussed above, as depicted in FIG. 2. Such grounding of the housing 2 may be facilitated by providing plating material 14 in one or more aperture 10. In the preferred embodiment of FIGS. 1 to 4 each leg 22 contacts plating material 14 in each respective aperture 10. If desired, an electrical and mechanical connection between leg 22 and plating material 14 may be facilitated by soldering. In the preferred embodiment, each length 22' of each leg 22 includes a distal end 72 which extends beyond the edge 54 of the printed circuit board 4 as depicted in FIGS. 2 and 3.

Figure 5:
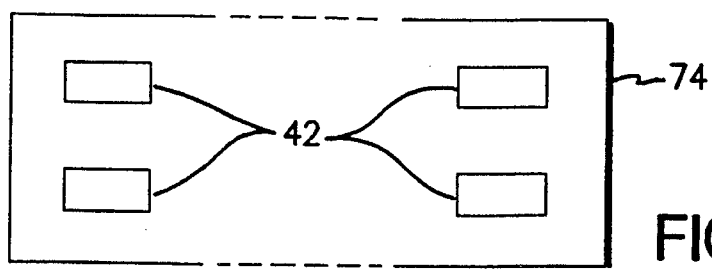
FIGS. 5 to 5C are a diagrammatic representation depicting the preferred embodiment of the method of the present invention.
Figure 5A:
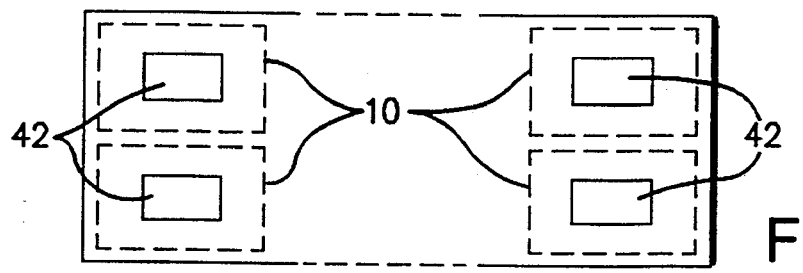
Figure 5B:
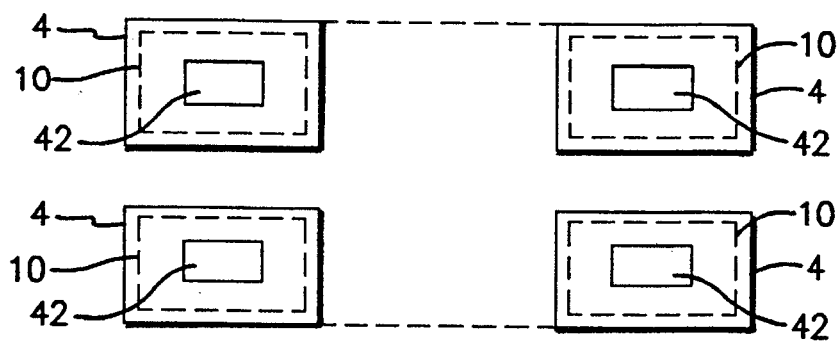
Figure 5C:
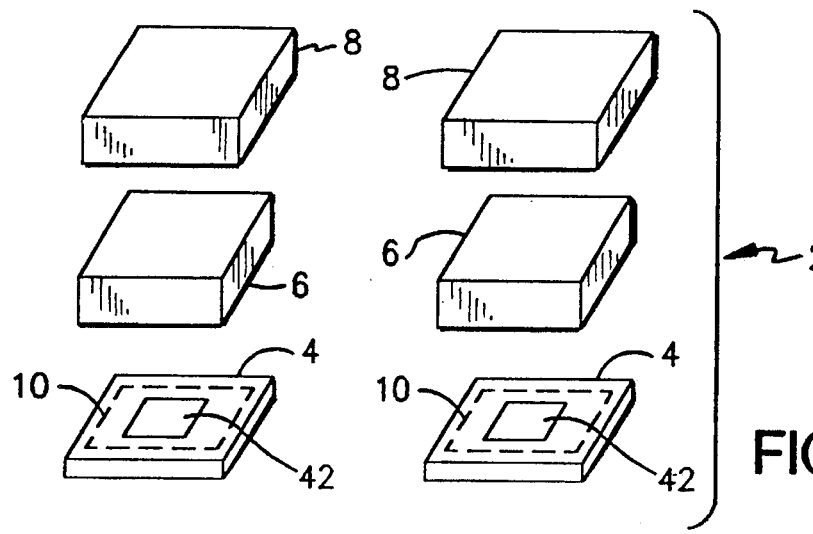

Conventional manufacturing equipment may be used in fabricating the self-contained drop-in component 2, and such component may be mass produced in different sizes and with different circuits as desired. For example, and with reference to FIG. 5, a plurality of self-contained circuits 42 each having an input and an output, not shown, may be formed upon a length of printed circuit board 74. With reference to FIG. 5A, a periphery of apertures 10, which extend through the length of printed circuit board 74, may be formed around each self-contained contained circuit 42. Circuits 42 may be identical or may vary. The plurality of circuits 42 may be selectively built directly on printed circuit board 74 using surface mount connection techniques which include adding plating material to line apertures 10 as desired. Each select circuit may be provided at a select location of the printed circuit board 74 and associated with a patten of apertures 10 which identifies an individual printed circuit board 4. With reference to FIG. 5B, the length of printed circuit board 74 may be cut to divide it into a plurality of individual printed circuit boards 4 each of which comprises a self-contained circuit 42 surrounded by a periphery of apertures 10 and having an input and an output extending therefrom as described herein regarding the embodiment of FIGS. 1 to 4. As depicted in FIG. 5C, a length of side rail may be cut into a plurality of segments of side rail 6, each segment comprising a plurality of legs which extend in a first direction and a plurality of clips which extend in an opposite second direction as described herein regarding the embodiment of FIGS. 1 to 4, and each segment of side rail 6 may be folded into a configuration and peripheral size which is substantially the same as the configuration and peripheral size of a respective individual printed circuit board 4. For example, select lengths of side rail material may be drawn and cut from a reel of side rail material and then bent to conform to the configuration and peripheral size of each respective printed circuit board 4. As depicted in FIG. 2, each leg 22 of each segment of side rail 6 depicted in FIG. 5C may be inserted into a respective aperture 10 of a respective individual printed circuit board 4, and a length 22' of each such leg 22 may be folded against a conductive portion of a surface of a respective printed circuit board 4 which is external of the component 2 being fabricated. As depicted in FIG. 3, each cover 8 depicted in FIG. 5C may be attached to each segment of side rail 6 by inserting a side 36 into a respective clip 30. If desired covers 8 may be fabricated during the process. For example, select lengths of sheet metal may be drawn and cut from a reel of sheet metal material and then stamped or punched to form covers of predetermined sizes to fit each respective side rail configuration. Each of the foregoing steps may be effected in any conventional manner. After the self-contained drop-in components 2 are fabricated, minor adjustment or tuning of each circuit may be accomplished in a conventional manner through the small holes 76 in the top 34 of cover 8 and such holes may then be covered with metal foil for further shielding.

Figure 6:
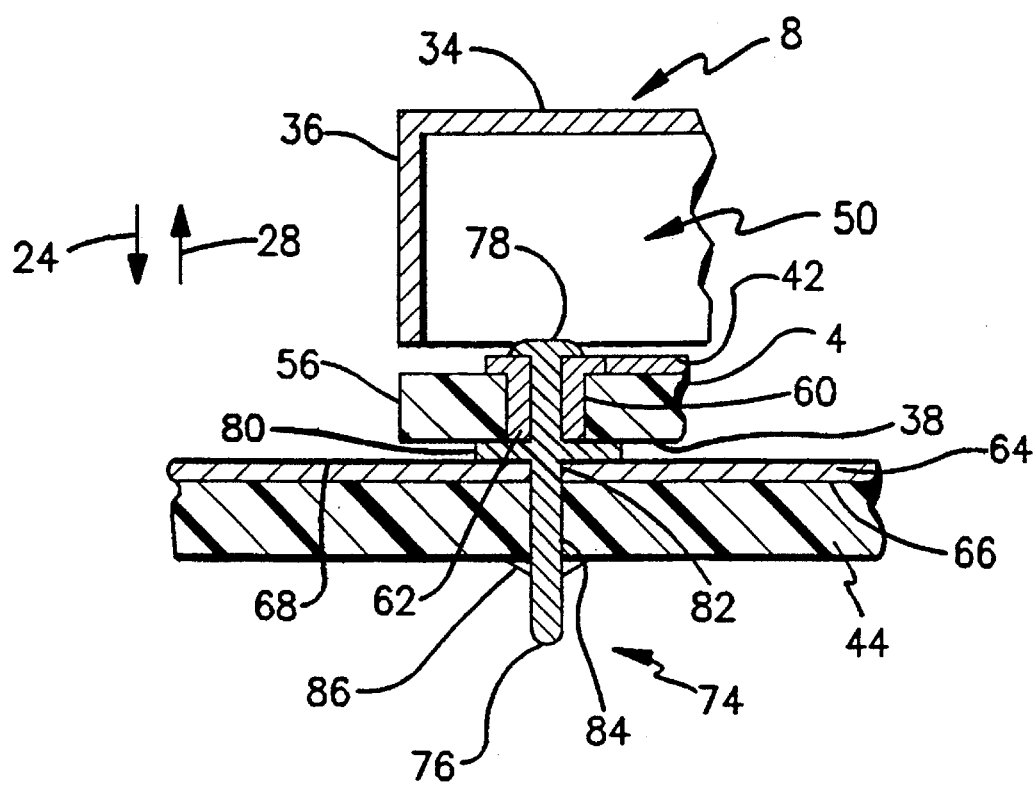
FIG. 6 is a view of an alternative embodiment of the view depicted in FIG. 4.

In an alternative embodiment depicted in FIG. 6 wherein like elements are designated by like numerals, the input 46 of FIGS. 1 to 4 is replaced by an input 74. In a like manner, the output 48 of FIGS. 1 to 4 is replaced by an output (not shown) identical to input 74. Therefore, the comments herein regarding replacement input 74 are equally applicable to the replacement output. Input 74 is in the form of an elongated pin 76 which extends through the printed circuit board 4, and is electrically and mechanically connected to the self-contained circuit 42. For example, in the embodiment of FIG. 7, electrically conductive material 62 lines the connecter hole 60. The electrically conductive material 62 is electrically and mechanically connected to the self contained circuit 42 and to the pin 76 which forms input 74. Pin 76 is flattened to form a rivet 78 and includes a shoulder 80. The pin 76 is held in place by essentially sandwiching the printed circuit board 4 and conductive material 62 between rivet 78 and shoulder 80. Shoulder 80 also provides consistency in spacing and ease of assembly. Input 74 is electrically and mechanically connectable to and disconnectable from circuit 64 of the printed circuit board 44. In particular, the shoulder 80 of pin 76 may be moved into and out of electrical contact with circuit 64 by moving pin 76 into and out of apertures 82 and 84 of circuit 64 and printed circuit board 44, respectively. Pin 76 may be held in place by soldering at 86.

The present invention provides an individual drop-in component 2 which may be attached by surface mount connection techniques to a circuit board 44 as described herein. The component 2 provides a printed circuit board which is shielded and strengthened by a side rail and cover. The component may be re-opened if required by straightening the legs 22 and removing the cover 8. Minor adjustments to the circuitry within the housing can be accomplished through the tuning holes 76 in the cover 8.

Cost will be reduced in several ways. The printed circuit board 4 serves as the header for the circuit 42 and the base of the component or package. In addition, several circuit components can be etched on the printed circuit board. Further, the cover 8 and the side rail 6 may be formed from a stamped clip rail and a stamped cover that clips into the clip rail. In addition, the side rail is attached to the printed circuit board base by legs which are integral with the side rail and which extend through holes in the printed circuit board to produce ground connections for the component. The side rail 6 provides an effective electrical shield relative to the circuitry within the component. If desired, the effectiveness of the shield can be further improved to improve isolation and eliminate leakage, and attachment of the side rail to the base may be facilitated, by applying solder paste at the interface between the side rail 6 and printed circuit board 4.

The component of the present invention is useful with electrical circuits of various degrees of complexity. For example, although useful with a single filter circuit such as an edge coupled microstrip bandpass filter which comprises a printed circuit board, side rail 10 and cover, the housing is also useful with, for example, a multiport device comprising the printed circuit board, side rail and cover, in combination with capacitors, inductors and transistors. It will be apparent to those skilled in the art that the component of the present invention is applicable for use with, for example, filters, couplers, amplifiers, mixers and various other components which may be installed in other circuits with little concern for cross talk and interference with other components, even at frequencies which exceed 3 GHz.

The embodiments which have been described herein are but some of several which utilize this invention and are set forth here by way of illustration but not of limitation. It is apparent that many other embodiments which will be readily apparent to those skilled in the art may be made without departing materially from the spirit and scope of this invention.

I claim:

1. A self contained drop-in component, comprising:
   a first printed circuit board removably attachable to a second printed circuit board, said first printed circuit board having a self-contained circuit including an input and an output electrically and mechanically connected to said self-contained circuit and electrically and mechanically connectable to and disconnectable from a circuit of said second printed circuit board, said first printed circuit board having an edge which forms a periphery of said component, said first printed circuit board having a plurality of apertures extending therethrough adjacent said periphery;
   a side rail adjacent said periphery and comprising a plurality of legs extending in a first direction and a plurality of clips extending in an opposite second direction, respective legs of said plurality of legs extending through respective apertures of said plurality of apertures, one or more of said respective legs comprising a length which is folded against a conductive portion of a surface of said first printed circuit board which is external of said component; and said side rail peripherally enclosing said self-contained circuit; and
   a cover comprising a side which is attached to said side rail by said plurality of clips, said printed circuit board, side rail and cover comprising a housing having a housing cavity in which said self-contained circuit is positioned.

2. The self-contained drop-in component of claim 1 wherein said input comprises at least one first connector which extends out of said housing from said housing cavity, and further wherein said output comprises at least one second connector which extends out of said housing from said housing cavity.

3. The self-contained drop-in component of claim 2 wherein said at least one first connector and said at least one second connector each comprises a first segment which is folded against said surface of said first printed circuit board which is external of said component.

4. The self-contained drop-in component of claim 1 wherein each length of said one or more of said respective legs comprises a distal end which extends beyond said edge of said first printed circuit board.

5. The self-contained drop-in component of claim 3 wherein each first segment of said at least one first connector and said at least one second connector each comprises a distal end which extends beyond said edge of said first printed circuit board.

6. The self-contained drop-in component of claim 5 wherein each length of said one or more of said respective legs comprises a distal end which extends beyond said edge of said first printed circuit board.

7. The self-contained drop-in component of claim 3 wherein said first printed circuit board comprises at least one first connector hole and at least one second connector hole, said at least one first connector and said at least one second connector each comprising a second segment which extends at about 90° relative to said surface of said first printed circuit board which is external of said component, each second segment of said at least one first connector extending into a first connector hole of said at least one first connector hole and being electrically connected to said self-contained circuit, and each second segment of said at least one second connector extending into a second connector hole of said at least one second connector hole and being electrically connected to said self-contained circuit.

8. The self-contained drop-in component of claim 7 wherein a first electrically conductive material lines each first connector hole and is electrically and mechanically connected to said self-contained circuit and a respective second segment of said at least one first connector, and further wherein a second electrically conductive material lines each second connector hole and is electrically and mechanically connected to said self-contained circuit and a respective second segment of said at least one second connector.

9. The self-contained drop-in component of claim 8 wherein each respective aperture of said plurality of apertures is lined with an electrically conductive material.

10. The self-contained drop-in component of claim 1 wherein each respective aperture of said plurality of apertures is lined with an electrically conductive material.

11. The self-contained drop-in component of claim 2 wherein said at least one first connector and said at least one second connector each comprise a pin which extends out of said housing from said housing cavity.

12. The self-contained drop-in component of claim 11 wherein said pin extends at about 90° relative to said surface of said first printed circuit board.

13. The self-contained drop-in component of claim 12 wherein said pin includes a first length which extends into said housing cavity, a second length which extends out of said housing cavity, and a shoulder positioned between said first length and said second length, said shoulder engaging said surface.

14. The self-contained drop-in component of claim 13 wherein said first length comprises an end which is spaced from said shoulder, said end being flattened to hold said pin in place.

15. The self-contained drop-in component of claim 14 wherein each length of said one or more of said respective legs comprises a distal end which extends beyond said edge of said first printed circuit board.

16. The self-contained drop-in component of claim 15 wherein said first printed circuit board comprises at least one first connector hole and at least one second connector hole, said first length of said pin of said at least one first connector, and said first length of said pin of said at least one second connector, extending into a first connector hole of said at least one first connector hole and being electrically connected to said self-contained circuit, and into a second connector hole of said at least one second connector hole and being electrically connected to said self-contained circuit, respectively.

17. The self-contained drop-in component of claim 16 wherein a first electrically conductive material lines each first connector hole and is electrically and mechanically connected to said self-contained circuit and a respective first length of said pin of said at least one first connector and further wherein a second electrically conductive material lines each second connector hole and is electrically and mechanically connected to said self-contained circuit and a respective first length of said pin of said at least one second connector.

18. The self-contained drop-in component of claim 17 wherein each respective aperture of said plurality of apertures is lined with an electrically conductive material.

19. A method of fabricating a self-contained drop-in component comprising the steps of:

forming a plurality of self-contained circuits upon a length of printed circuit board, each self-contained circuit comprising an input and an output extending therefrom;

forming a periphery of apertures, which extend through said length of printed circuit board, around each self-contained circuit of said plurality of self-contained circuits;

dividing said length of printed circuit board into a plurality of individual printed circuit boards, each individual printed circuit board comprising a self-contained circuit surrounded by a periphery of apertures;

cutting a length of side rail into a plurality of segments of side rail, each segment of said plurality of segments comprising a plurality of legs which extend in a first direction and a plurality of clips which extend in an opposite second direction;

forming each segment of said plurality of segments of side rail into a configuration and peripheral size which is substantially the same as a configuration and peripheral size of an individual printed circuit board of said plurality of individual printed circuit boards;

inserting each leg of said plurality of legs of each segment into a respective aperture of said periphery of apertures of a respective individual printed circuit board;

folding a length of at least one leg of said plurality of legs against a conductive portion of a surface of a respective individual printed circuit board of said plurality of individual printed circuit boards which is external of said component; and attaching a cover to each segment by inserting a side of said cover into respective clips of said plurality of clips.

20. A method of fabricating a self-contained drop-in component comprising the steps of:

forming a self-contained circuit upon a length of printed circuit board, said self-contained circuit comprising an input and an output extending therefrom;

forming a periphery of apertures, which extend through said length of printed circuit board, around a peripheral edge of said length of printed circuit board;

cutting a length of side rail into a segment of side rail, said segment of side rail comprising a plurality of legs which extend in a first direction and a plurality of clips which extend in an opposite second direction;

forming said segment of side rail into a configuration and peripheral size which is substantially the same as a configuration and peripheral size of said length of printed circuit board;

inserting each leg of said plurality of legs of said segment of side rail into a respective aperture of said periphery of apertures of said length of printed circuit board;

folding a length of at least one leg of said plurality of legs against a conductive portion of a surface of said length of printed circuit board which is external of said component; and attaching a cover to said segment of side rail by inserting a side of said cover into respective clips of said plurality of clips.

* * * * *